(12) United States Patent
Jakobi et al.

(10) Patent No.: US 10,903,158 B2
(45) Date of Patent: Jan. 26, 2021

(54) SEMICONDUCTOR ARRANGEMENT HAVING A CIRCUIT BOARD WITH A PATTERNED METALLIZATION LAYER

(71) Applicant: Infineon Technologies AG, Neubiberg (DE)

(72) Inventors: Waldemar Jakobi, Soest (DE); Christoph Koch, Salzkotten (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/880,664

(22) Filed: May 21, 2020

(65) Prior Publication Data

US 2020/0286820 A1    Sep. 10, 2020

Related U.S. Application Data

(63) Continuation of application No. 16/179,015, filed on Nov. 2, 2018, now Pat. No. 10,692,806.

(30) Foreign Application Priority Data

Nov. 3, 2017    (EP) .................................... 17199950

(51) Int. Cl.
*H01L 23/498*     (2006.01)
*H01L 23/00*      (2006.01)
(Continued)

(52) U.S. Cl.
CPC .. *H01L 23/49844* (2013.01); *H01L 23/49811* (2013.01); *H01L 23/5386* (2013.01);
(Continued)

(58) Field of Classification Search
CPC . H01L 2224/48091; H01L 2224/48472; H01L 2224/48227; H01L 2224/49175;
(Continued)

(56) References Cited

U.S. PATENT DOCUMENTS

| 6,278,199 B1 * | 8/2001 | Grant ...................... H01L 24/49 307/10.1 |
| 2003/0112605 A1 * | 6/2003 | Hable ..................... H01L 24/49 361/728 |

(Continued)

FOREIGN PATENT DOCUMENTS

EP    0533158 A2    3/1993

*Primary Examiner* — Jonathan Han
(74) *Attorney, Agent, or Firm* — Murphy, Bilak & Homilier, PLLC

(57) ABSTRACT

A semiconductor arrangement includes a circuit board having a metallization layer with first and second conductor tracks, and individual semiconductor chips each having a controllable semiconductor element, first and second load electrodes, and a control electrode. The first conductor track has a base section and further sections extending from the base section. The second conductor track has sections. The further sections of the first conductor track and the sections of the second conductor track extend parallel to one another in a first direction at least over a same lateral dimension of the individual semiconductor chips. The further sections of the first conductor track alternate with the sections of the second conductor track in a second direction orthogonal to the first direction. The individual semiconductor chips are arranged on the sections of the second conductor track. The first load electrodes are connected to the further sections of the first conductor track.

15 Claims, 3 Drawing Sheets

(51) Int. Cl.
*H01L 25/07* (2006.01)
*H01L 23/538* (2006.01)
*H01L 25/18* (2006.01)
*H01L 23/373* (2006.01)

(52) U.S. Cl.
CPC .............. *H01L 24/48* (2013.01); *H01L 24/49* (2013.01); *H01L 24/73* (2013.01); *H01L 25/072* (2013.01); *H01L 25/18* (2013.01); H01L 23/3735 (2013.01); H01L 2224/45014 (2013.01); H01L 2224/45015 (2013.01); H01L 2224/48139 (2013.01); H01L 2224/48225 (2013.01); H01L 2224/48227 (2013.01); H01L 2224/49111 (2013.01); H01L 2224/49175 (2013.01); H01L 2224/73265 (2013.01); H01L 2924/00014 (2013.01); H01L 2924/10272 (2013.01); H01L 2924/13055 (2013.01); H01L 2924/13091 (2013.01); H01L 2924/19107 (2013.01)

(58) Field of Classification Search
CPC ........... H01L 2224/49111; H01L 24/48; H01L 24/49; H01L 25/072
USPC .................................................. 257/691, 723
See application file for complete search history.

(56) References Cited

U.S. PATENT DOCUMENTS

2006/0290689 A1\* 12/2006 Grant .................... H02M 7/003
                                                           345/204
2011/0102054 A1\* 5/2011 Domes .................... H01L 24/49
                                                           327/419
2016/0056132 A1  2/2016 Bayerer et al.

\* cited by examiner

US 10,903,158 B2

SEMICONDUCTOR ARRANGEMENT HAVING A CIRCUIT BOARD WITH A PATTERNED METALLIZATION LAYER

TECHNICAL FIELD

The instant disclosure relates to semiconductor arrangements having controllable semiconductor elements.

BACKGROUND

Semiconductor arrangements like power semiconductor modules or the like are widely used in automotive, industrial, and consumer electronic applications for driving loads, converting power, or the like. Typically, such a semiconductor arrangement includes at least one controllable semiconductor element, each having a first load electrode, a second load electrode, a load path formed therebetween, and a control electrode for controlling the load path. In order to achieve a high rated current, the arrangement may include two or more controllable semiconductor elements electrically connected in parallel such that their load paths are electrically connected in parallel, e.g. by electrically connecting the first load electrodes to one another, and by electrically connecting the second load electrodes to one another. Optionally, also the control electrodes may be electrically connected to one another. In the ideal case, the two or more controllable semiconductor elements electrically connected in parallel are operated synchronously by feeding a common control voltage (e.g. provided by a controller) to the individual controllable semiconductor elements using electrical lines.

Because the switching state of a controllable semiconductor element, e.g. whether the load path is electrically conducting or blocking, depends on its individual control voltage, i.e. on the difference between the electric potential of the control electrode and, e.g., the first load electrode of the corresponding controllable semiconductor element, a large current flowing through a line electrically connecting the first load electrodes can, in combination with the inevitable ohmic resistance and/or inductance of that line, lead to significantly different electric potentials at the first load electrodes of the different controllable semiconductor elements. Therefore, there may be situations in which the switching states of different controllable semiconductor elements significantly differ from each other. That is, there may be instants of time at which the load paths of some of the controllable semiconductor elements are electrically conducting, whereas the control paths of the remaining controllable semiconductor elements are electrically blocking. As a result, the electric load current through the controllable semiconductor elements having their load paths connected in parallel and, therefore, the thermal and electrical load caused by the electric load current are unevenly distributed among the controllable semiconductor elements. Hereby, the lifetime of the more heavily burdened controllable semiconductor elements may be reduced. Further, different switching states may also be caused by undesired interbody-oscillations between the controllable semiconductor elements.

The described problems are, without being restricted to, of particular interest with regard to fast switching semiconductor elements like semiconductor elements based on silicon carbide (e.g. SiC-based MOSFETs or SiC-based IGBTs) because the silicon-carbide-based semiconductor chips presently available have small foot print areas and, therefore, low rated currents so that there is a frequent requirement of electrically connecting silicon-carbide-based semiconductor chips in parallel.

There is a need for a semiconductor assembly that reduces or prevents at least one of the drawbacks that can occur when the load paths of two or more controllable semiconductor elements are operated in parallel.

SUMMARY

The semiconductor arrangement includes a circuit board comprising a metallization layer with a first conductor track and a second conductor track, and a plurality of individual semiconductor chips each comprising a controllable semiconductor element, a first load electrode, a second load electrode and a control electrode, the first load electrodes of the individual semiconductor chips electrically connected to one another, the second load electrodes of the individual semiconductor chips electrically connected to one another, and the control electrodes of the individual semiconductor chips electrically connected to one another. The first conductor track includes a base section and a first, second and third section, the third section arranged between the first and the second section, and the second conductor track includes a first and a second section. The first section of the second conductor track is arranged between the first and the third section of the first conductor track, the second section of the second conductor track is arranged between the second and the third section of the first conductor track, and the third section of the first conductor track is arranged between the first and the second section of the second conductor track. A first subset and a second subset of the plurality of semiconductor chips are arranged on the first section of the second conductor track, and a third subset and a fourth subset of the plurality of semiconductor chips are arranged on the second section of the second conductor track. The first load electrode of each of the semiconductor chips of the first and the second subset is, via at least one first electrical connection, electrically connected to the first section of the first conductor track and, via at least one second electrical connection, to the third section of the first conductor track. Further, the first load electrode of each of the semiconductor chips of the third and the fourth subset is, via at least one third electrical connection, electrically connected to the third section of the first metallization and, via at least one fourth electrical connection, to the second section of the first conductor track.

The invention may be better understood with reference to the following drawings and the description. The components in the figures are not necessarily to scale, emphasis instead being placed upon illustrating the principles of the invention. Moreover, in the figures, like reference numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. As well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element".

Figure 1:
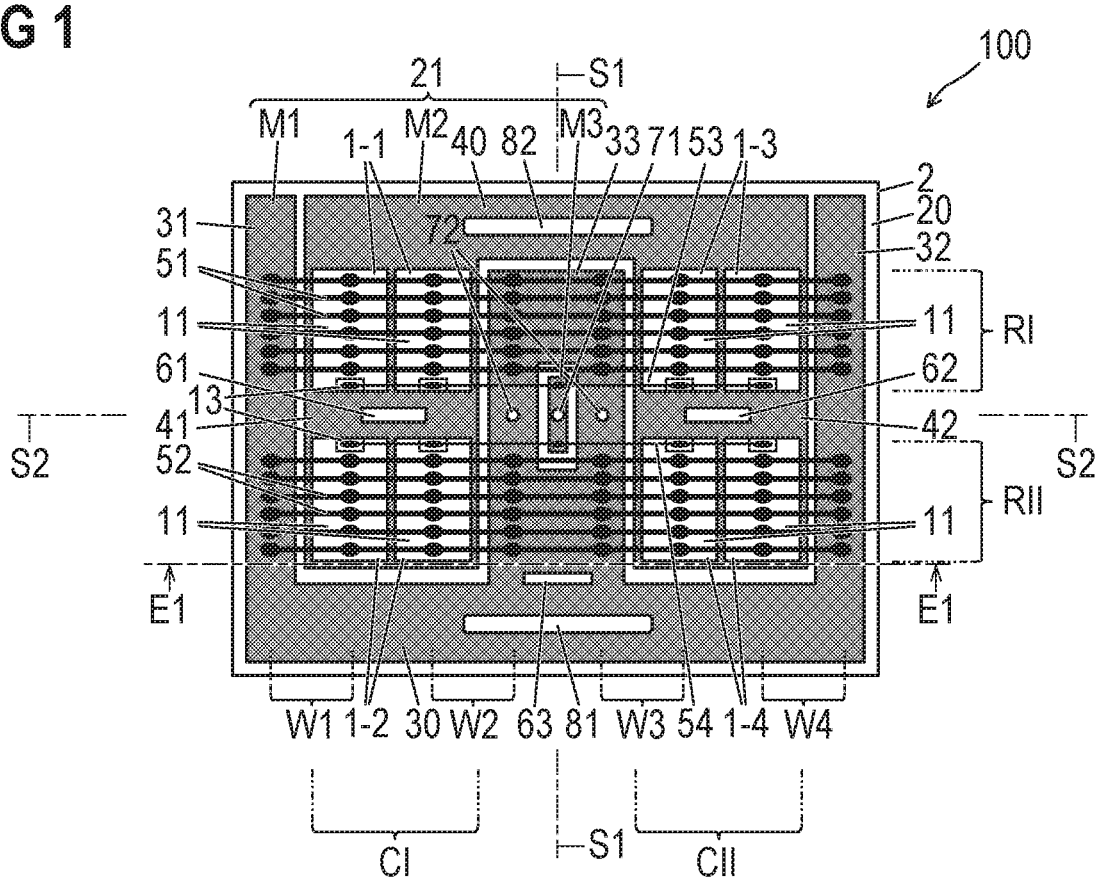
FIG. 1 is a top view illustrating an exemplary semiconductor arrangement.
Figure 2:
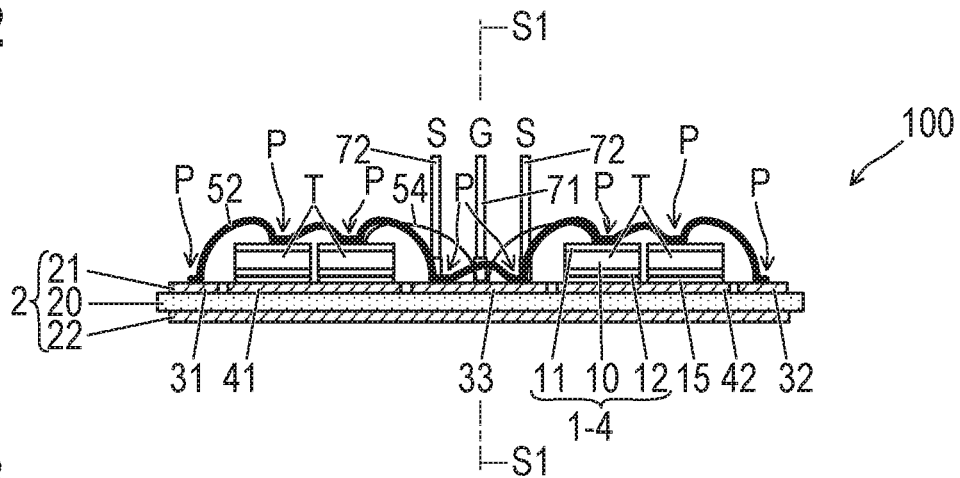
FIG. 2 is a cross-sectional view of the semiconductor arrangement of FIG. 1 in a cross-sectional plane E1-E1.
Figure 3:
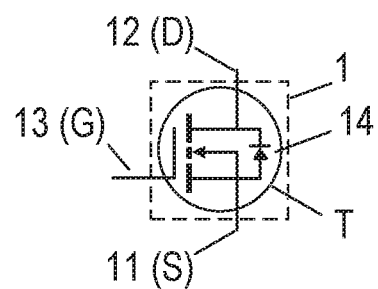
FIG. 3 is an electronic symbol of an exemplary controllable semiconductor element comprising a MOSFET.

FIG. 1 is a top view illustrating an exemplary semiconductor arrangement 100, FIG. 2 is a cross-sectional view of the semiconductor arrangement of FIG. 1 in a cross-sectional plane E1-E1, and FIG. 3 is an electronic symbol of a controllable semiconductor element comprising a MOSFET.

Referring to FIGS. 1 and 2, the exemplary semiconductor arrangement 100 includes a circuit board 2 and a plurality (here: eight) of semiconductor chips 1 arranged on the circuit board 2. Each of the semiconductor chips 1 comprises a semiconductor body 10, and each semiconductor body 10 (and, therefore, each of the semiconductor chips 1) comprises a controllable semiconductor element T.

Each semiconductor chip 1 includes, in addition to the semiconductor body 10, a first load electrode 11 arranged on the semiconductor body 10, a second load electrode 12 arranged on the semiconductor body 10, and a control electrode 13 arranged on the semiconductor body 10. Without being restricted to, the first load electrode 11 and the control electrode 13 may be arranged on that surface of the semiconductor body 10 facing away from the circuit board 2, and the second load electrode 12 may be arranged on that surface of the semiconductor body 10 facing towards the circuit board 2. Each of the controllable semiconductor elements T includes a load path integrated in the semiconductor body 10 between the first and second load electrodes 11, 12 of the respective controllable semiconductor element T.

In order to control a load path of a controllable semiconductor element T, i.e. in order to control the electrical conductivity of the load path, a control voltage may be applied between the control electrode 13 and one of the first or second load electrodes 11, 12. The electrical conductivity of the load path depends on the absolute value and the polarity of the control voltage and on the design of the controllable semiconductor element T so that a desired state of the electrical conductivity of the load path (e.g. "switched ON", i.e. load path=electrically conductive, or "switched OFF", i.e. load path=electrically blocking) may be achieved by appropriately adjusting the control voltage.

As described above, the semiconductor body 10 of each of the semiconductor chips 1 includes an individual controllable semiconductor element T. Different controllable semiconductor elements T may be identical to each other. In this sense, "identical" may mean identical "apart from fabrication tolerances." Examples of suitable controllable semiconductor elements T include, without being restricted to, unipolar or bipolar transistors, thyristors, or any other controllable semiconductor elements. If the controllable semiconductor elements T comprise transistors, the identical controllable semiconductor elements T may comprise, e.g., IGFETs (Insulated Gate Field Effect Transistors) like MOSFETs (Metal Oxide Semiconductor Field-Effect Transistors) or IGBTs (Insulated Gate Bipolar Transistors; e.g. reverse conducting IGBTs), or JFETs (Junction Field Effect Transistors), HEMTs (High-electron-mobility transistors), BJTs (Bipolar Junction Transistors), or any other type of transistor. Depending on the type of controllable semiconductor element T, the first load electrode 11 and the second load electrode 12 may be a source electrode and a drain electrode, or a drain electrode and a source electrode, an emitter electrode and a collector electrode, or a collector electrode and an emitter electrode, and the control electrode 13 may be a gate electrode or a base electrode. The principles of design and operation of such semiconductor elements T are known in the art so that no further explanations are required in this regard.

FIG. 3 illustrates an electronic symbol of an exemplary controllable semiconductor element T comprising a MOSFET. As schematically illustrated in FIG. 3, a semiconductor chip 1 that includes a controllable semiconductor element T may optionally also include an integrated diode 14 which may, depending on the application, operate as freewheeling diode. If the controllable semiconductor element T comprises a MOSFET, it may include an inherent body diode which forms the integrated diode 14. If the controllable semiconductor element T comprises an RC-IGBT (reverse conducing IGBT), the corresponding semiconductor chip 1 may include an inherent freewheeling diode that allows for reverse conducting operation and that may form the integrated diode 14.

As is further illustrated in FIGS. 1 and 2, the circuit board 2 includes a first metallization layer 21 which may be attached to a dielectric layer 20, and an optional second metallization layer 22 which may also be attached to the dielectric layer 20. If there is a second metallization layer 22, the dielectric layer 20 may be arranged between the first and second metallization layers 21, 22.

Each of the first and, if provided, second metallization layers 21, 22 may consist of or include, without being restricted to, one of the following materials: copper; a copper alloy; aluminum; an aluminum alloy; any other metal or alloy that remains solid during the operation of the semiconductor assembly. According to one example, the circuit board 2 may be a ceramic substrate, that is, it may include a dielectric layer 20 which is a ceramic, e.g. a thin ceramic layer. The ceramic may, without being restricted to, consist of or include one of the following materials: aluminum oxide; aluminum nitride: zirconium oxide: silicon nitride: boron nitride; any other dielectric ceramic. For instance, the circuit board 2 may be, e.g., a Direct Copper Bonding (DCB) substrate, a Direct Aluminum Bonding (DAB) substrate, or an Active Metal Brazing (AMB) substrate. According to another example, the circuit board 2 may be a conventional printed circuit board (PCB) having a non-ceramic dielectric layer 20. For instance, a non-ceramic dielectric layer 20 may consist of or include a cured resin. Irrespective of the materials of the first and (if provided) second metallization layers 21, 22 and (if provided) the dielectric layer 20, the circuit board 2 may be free of electrical connections such as, e.g., vias (via="vertical interconnect access") that pierce the dielectric layer 20 and electrically interconnect the first and second metallization layers 21, 22. In other embodiments however, such vias may be provided.

As is further illustrated in FIGS. 1 and 2, the first metallization layer 21 includes a first conductor track M1 and a second conductor track M2 arranged distant from one another. According to the present disclosure, a conductor track of the first metallization layer 21 is completely formed by material from the first metallization layer. That is, each section of such a conductor track is electrically connected to each other section of the same conductor track only by material of that conductor track, and, therefore, only by material of the first metallization layer 21.

The first conductor track M1 includes a base section 30, a first section 31, a second section 32 and a third section 33. The third section 33 is arranged between the first section 31 and the second section 32 in a horizontal direction of the circuit board 2. That is, when seen from above (see top view illustrated in FIG. 1) the first conductor track M1 is essentially W-shaped, with the first, second and third section 31, 32, 33 forming the arms of the W and the base section 30 forming the base of the W. Further, the second conductor track M2 includes a base section 40, a first section 41 and a second section 42. The first section 41 of the second conductor track M2 is arranged between the first section 31 and the third section 33 of the first conductor track M1, the second section 42 of the second conductor track M2 is arranged between the second section 32 and the third section 33 of the first conductor track M1, and the third section 33 of the first conductor track M1 is arranged between the first section 41 and the second section 42 of the second conductor track M2, in a horizontal direction of the circuit board 2. That is, when seen from above (see top view illustrated in FIG. 1) the second conductor track M2 is essentially U-shaped, with the first section 41 and the second section 42 of the second conductor track M2 forming the arms of the U and the base section 40 of the second conductor track M2 forming the base of the U.

The plurality of semiconductor chips 1 includes at least four subsets of semiconductor chips 1, wherein each of the subsets includes at least one of the plurality of semiconductor chips 1, and wherein the subsets do not intersect. In FIGS. 1 and 2, the semiconductor chips 1 of the first subset are labelled with 1-1, the semiconductor chips 1 of the second subset are labelled with 1-2, the semiconductor chips 1 of the third subset are labelled with 1-3, and the semiconductor chips 1 of the fourth subset are labelled with 1-4. That is, in the example of FIGS. 1 and 2, each of the subsets includes two of the plurality of semiconductor chips 1. In general, however, each of the subsets may include at least one, at least two, at least three, . . . of the plurality of semiconductor chips 1. Optionally but without being restricted to, each of the subsets may include the same number of semiconductor chips 1.

As can be seen from FIG. 1, the first subset (including the semiconductor chips 1-1) and the third subset (including the semiconductor chips 1-3) may be arranged in a first row RI, the second subset (including the semiconductor chips 1-2) and the fourth subset (including the semiconductor chips 1-4) may be arranged in a second row RII, the first subset (including the semiconductor chips 1-1) and the second subset (including the semiconductor chips 1-2) may be arranged in a first column CI, and the third subset (including the semiconductor chips 1-3) and the fourth subset (including the semiconductor chips 1-4) may be arranged in a second column CII, and the third section 33 of the first conductor track M1 may extend between the first column CI and the second column CII. Thereby, the first and second rows RI. RII may be arranged parallel or substantially parallel to one another, the first and second columns CI and CII may be arranged parallel or substantially parallel to one another, each of the first and second rows RI, RII may be arranged perpendicular or substantially perpendicular to each of the first and second columns CI and CII, and the third section 33 of the first conductor track M1 may be arranged parallel or substantially parallel to each of the first and second columns CI, CII.

As can also be seen from FIG. 1, the semiconductor chips 1-1 of the first subset and the semiconductor chips 1-2 of the second subset are arranged on the first section 41 of the second conductor track M2, and the semiconductor chips 1-3 of the third subset and the semiconductor chips 1-4 of the fourth subset are arranged on the second section 42 of the second conductor track M2. As demonstrated in FIG. 2 by way of example for the semiconductor chips 1-2 and 1-4, each of the semiconductor chips 1 is, at its second load electrode 12, electrically connected to that section of the conductor track (here: the first or second section 41, 42 of the second conductor track M2) on which it is arranged using an electrically conductive connection layer 15, e.g. a solder layer, a layer of an electrically conductive adhesive or a layer of a sintered metal powder. The first load electrode 11 of each of the semiconductor chips 1-1, 1-2 of the first and second subsets is, via at least one first electrical connection W1, electrically connected to the first section 31 of the first conductor track M1 and, via at least one second electrical connection W2, to the third section 33 of the first conductor track M1. Then, the first load electrode 11 of each of the semiconductor chips 1-3, 1-4 of the third and fourth subsets is, via at least one third electrical connection W3, electrically connected to the third section 33 of the first conductor track M1 and, via at least one fourth electrical connection W4, to the second section 32 of the first conductor track M1. That is, the first load electrode 11 of each of the semiconductor chips 1-1, 1-2 of the first and second subsets is, via different electrical connections W1 and W2, electrically connected to both the first and third section 31, 33 of the first conductor track M1, and the first load electrode 11 of each of the semiconductor chips 1-3, 1-4 of the third and fourth subsets is, via different electrical connections W3 and W4, electrically connected to both the third and second section 33, 32 of the first conductor track M1.

As illustrated by the example of FIGS. 1 and 2, a first electrical connection W1 and a second electrical connection W2 may be formed by a single connection line 51 or 52. Similarly, a third electrical connection W3 and a fourth electrical connection W4 may be formed by a single connection line 51 or 52. It is also possible that a first electrical connection W1, a second electrical connection W2, a third electrical connection W3 and a fourth electrical connection W4 are formed by a single connection line 51 or 52. Each of the mentioned electrical connections may be realized using any kind of electrical connection, e.g. a wire or a metal strip, which is, at respective points P of attachment electrically connected to the respective first load electrode 11 and the respective section 31, 32, 33 which it connects. In FIG. 1, the points P of attachment are schematically illustrated by bold oval dots.

A connection line 51, 52 may be attached and thereby electrically connected at a point P of attachment to the respective first, second or third section 31, 32, 33 or to the respective first load electrode 11 using any suitable technology like soldering, welding, wire bonding, electrically conductively adhering and so on. In this context, wire bonding means that a wire is, at the respective point P of attachment, directly attached to and therefore directly contacts the respective first, second or third section 31, 32, 33 or the respective first load electrode 11. A wire may have a circular or non-circular cross-section in sections connecting different points P of attachment. At the points P of attachment, the wire may be deformed. Wires having a non-circular, flat cross-section are often referred to as ribbons.

According to one example illustrated in FIG. 1, a single first connection line 51, e.g. a single (bonding) wire or a single metal strip, may be attached and electrically connected at a first point P of attachment to the first section 31 of the first conductor track M1, at second points P of attachment to the first load electrodes 11 of one or more semiconductor chips 1-1 of the first subset, at a third point P of attachment to the third section 33 of the first conductor track M1, at fourth points P of attachment to the first load electrodes 11 of one or more semiconductor chips 1-3 of the third subset, and at a fifth point P of attachment to the second section 32 of the first conductor track M1. Optionally, the respective electrical connections at the first, second, third, fourth and fifth points P of attachment may be realized using the same technology, e.g. one of the technologies mentioned above.

Alternatively or additionally, a single second connection line 52, e.g. a single (bonding) wire or a single metal strip, may, as illustrated in FIGS. 1 and 2, be attached and electrically connected at a first point P of attachment to the first section 31 of the first conductor track M1, at second points P of attachment to the first load electrodes 11 of one or more semiconductor chips 1-2 of the second subset, at a third point P of attachment to the third section 33 of the first conductor track M1, at fourth points P of attachment to the first load electrodes 11 of one or more semiconductor chips 1-4 of the fourth subset, and at a fifth point P of attachment to the second section 32 of the first conductor track M1. Optionally, the respective electrical connections at the first, second, third, fourth and fifth points P of attachment may be realized using the same technology, e.g. one of the technologies mentioned above.

According to a further option, the mentioned electrical connections at the first, second, third, fourth and fifth points P of attachment of the first connection line 51 and at the first, second, third, fourth and fifth points P of attachment of the second connection line 52 may be realized using the same technology, e.g. one of the technologies mentioned above.

According to still a further option, a single first connection line 51 and/or a single second connection line 52 may run perpendicular or substantially perpendicular to each of the first, second and third sections 31, 32, 33 of the first conductor track M1.

In any case, the load paths of the controllable semiconductor elements T integrated in the semiconductor bodies 10 of the semiconductor chips 1 of the first, second, third and fourth subsets are electrically connected in parallel because the first load electrodes 11 of the semiconductor chips 1 of the first, second, third and fourth subsets are electrically connected to one another via the first conductor track M1, and because the second load electrodes 12 of the semiconductor chips 1 of the first, second, third and fourth subsets are electrically connected to one another via the second conductor track M2.

In order to electrically interconnect the control electrodes 13 of each of the semiconductor chips 1-1, 1-2, 1-3, 1-4 forming the first, second, third and fourth subsets, the first metallization layer 21 may include a third conductor track M3 arranged distant from both the first and second conductor tracks M1 and M2, respectively. The third conductor track M3 may be an island surrounded by the third section of the first conductor track M1. As illustrated in FIG. 1, a single connection line 53 may be used to electrically connect the control electrodes 13 of each of the semiconductor chips 1-1, 1-3 forming the first and third subsets to the third conductor track M3, and a further single connection line 54 may be used to electrically connect the control electrodes 13 of each of the semiconductor chips 1-2, 1-4 forming the second and fourth subsets to the third conductor track M3. The connection line 53 is electrically connected, at points of attachment, to the control electrodes 13 of each of the semiconductor chips 1-1, 1-3 forming the first and third subsets, and to the third conductor track M3. Accordingly, the connection line 54 is electrically connected, at points of attachment, to the control electrodes 13 of each of the semiconductor chips 1-2, 1-4 forming the second and fourth subsets, and to the third conductor track M3. In FIG. 1, the points of attachment at which the connection lines 53 and 54 are attached and electrically connected to the respective control electrodes 13 and to the third conductor track M3, are schematically illustrated by non-bold oval dots. The technologies for producing the respective electrical connections at these points of attachment may be the same as mentioned above.

Switching the controllable semiconductor elements T synchronously may be achieved by a control voltage that is provided to the semiconductor arrangement 100 and evenly distributed among the controllable semiconductor elements T included in the semiconductor chips 1. The control voltage is the difference between a control potential which is, via the third conductor track M3 and the connection lines 53 and 54, provided to the control electrodes 13 of the semiconductor chips 1, and a reference potential which is, via the first conductor track M1 and (at least) one of the first, second, third or fourth electrical connections W1, W2, W3, W4 (e.g. one of the conductor lines 51 or 52), provided to the first load electrodes 11. The control potential may be provided to the third conductor track M3 via a control potential terminal 71 which is mounted on and electrically connected to the third conductor track M3. For instance, the control potential terminal 71 may be a pin that is pressed into a sleeve mounted on (e.g. soldered to) the third conductor track M3. Similarly, the reference potential may be provided to the first conductor track M1 via at least one reference potential terminal 72 which is mounted on and electrically connected to the third section 33 of the first conductor track M1. For instance, each reference potential terminal 72 may be a pin that is pressed into a sleeve mounted on (e.g. soldered to) the third section 33 of the first conductor track M1. As illustrated in FIGS. 1 and 2, there may be one control potential terminal 71 arranged between two reference potential terminals 72. Alternatively, one of the reference potential terminals 72 may be omitted.

Using two reference potential terminals 72 makes it possible that the electrical paths between a first one of the reference potential terminals 72 (e.g. the left one in FIGS. 1 and 2) and the first load electrode 11 of each of the semiconductor chips 1-1, 1-2 of the first and second subsets (i.e., there is one such path for each of the related semiconductor chips 1-1, 1-2) and the electrical paths between a second one of the reference potential terminals 72 (e.g. the right one in FIGS. 1 and 2) and the first load electrodes 11 of each of the semiconductor chips 1-3, 1-4 of the third and fourth subsets (i.e., there is one such path for each of the related semiconductor chips 1-3, 1-4) have substantially identical parasitic inductivities, substantially identical parasitic capacities and substantially identical parasitic resistances. In the example of FIGS. 1 and 2, there are eight semiconductor chips 1 and, therefore, eight such paths having at least one of: identical or substantially identical parasitic inductivities; identical or substantially identical parasitic capacities; and identical or substantially identical parasitic resistances.

According to a further option, the electrical paths between the control potential terminal 71 and the control electrode 13 of each of the semiconductor chips 1-1, 1-2, 1-3, 1-4 of the first, second, third and fourth subsets (i.e., there is one such path for each of the related semiconductor chips 1-1, 1-2, 1-3, 1-4) may have at least one of: identical or substantially identical parasitic inductivities, identical or substantially identical parasitic capacities, and identical or substantially identical parasitic resistances. In the example of FIGS. 1 and 2, there are eight semiconductor chips 1 and, therefore, eight such paths having at least one of: identical or substantially identical parasitic inductivities; identical or substantially identical parasitic capacities: and identical or substantially identical parasitic resistances.

According to still a further option, for each of the semiconductor chips 1-1, 1-2, 1-3, 1-4 of the first, second, third and fourth subsets there is an electrical path from a first load terminal 81 through the load path of the controllable semiconductor element T integrated in the corresponding semiconductor chip 1-1, 1-2, 1-3, 1-4 to a second load terminal 82 of the arrangement 100. These electrical paths may have at least one of: identical or substantially identical parasitic inductivities, identical or substantially identical parasitic capacities, and identical or substantially identical parasitic resistances. In the example of FIGS. 1 and 2, there are eight semiconductor chips 1 and, therefore, eight such paths having at least one of: identical or substantially identical parasitic inductivities: identical or substantially identical parasitic capacities; and identical or substantially identical parasitic resistances.

Also shown in FIG. 1 are first and second load terminals 81, 82 of the arrangement 100. The first load terminal 81 serves to allow for an easy electrical connection of the first load electrodes 11. As illustrated, the first load terminal 81 may be arranged on and electrically connected to the first conductor track M1, e.g. be arranged on and electrically connected to the base section 30. Analogously, the second load terminal 82 serves to allow for an easy electrical connection of the second load electrodes 12. As illustrated, the second load terminal 82 may be arranged on and electrically connected to the second conductor track M2, e.g. be arranged on and electrically connected to the base section 40.

Such a load terminal 81, 82 may, without being restricted to, be e.g. a metal sheet or a metal pin or a bonding wire. Instead of a single first load terminal 81 and/or a single second load terminal 82, multiple first load terminals 81 and/or multiple second load terminals 82 may be provided. The electrical connection between the first or the second load terminal 81, 82 and the corresponding conductor track M1, M2 may be realized using any appropriate technology like. e.g., soldering, welding, ultrasonic bonding, or electrically conductive adhering. Each of the load terminals 81, 82 is optional.

Instead of or in addition to a load terminal 81, 82, one or preferably several bonding wires (connected in parallel if two or more bonding wires are provided) may be used. For instance, several first bonding wires could be wire bonded to the base section 30 of the first conductor track M1 in order to replace or supplement the first load terminal(s) 81, and/or several second bonding wires could be wire bonded to the base section 40 of the second conductor track M2 in order to replace or supplement the second load terminal(s) 82. Such first and/or second bonding wires may be used in particular for electrically connecting the first or second load electrodes 11, 12 to a further electronic circuit that may additionally be formed on the circuit board 2 (which in this case needs to be enlarged in order to provide an additional area for carrying the further electronic circuit). For instance, if electrically parallelized semiconductor elements T integrated in the semiconductor chips 1 form a (logical) high or low side switch of a half bridge, the further circuit may include the corresponding (logical) low or high side switch of the half bridge. Such a corresponding (logical) low or high side switch may have a design analogously to the described arrangement. For instance, the logical high and low side switches may be electrically connected to one another using several (first or second) bonding wires electrically connected in parallel, or by extending one of the first or second conductor track M1, M2.

The present invention can provide for a high degree of symmetry of the parasitic inductivities, the parasitic capacities and the parasitic resistances of the electrical interconnections (e.g. the first conductor track M1, the second conductor track M2 and the connection lines 51, 52) with which the load paths of the semiconductor chips 1 are connected in parallel, and of the electrical interconnections (e.g. the third conductor track M3 and the connection lines 53, 54) with which the control electrodes 13 are electrically interconnected. As a result, the transmission characteristics of the electrical connections used for distributing a control voltage, which is supplied to the arrangement, among the semiconductor elements have a high degree of symmetry so that the control voltage is, on its way from a common control voltage input to the individual semiconductor elements, distorted substantially identical so that the individual semiconductor elements "see" almost the same (distorted) control voltage so that their switching behavior is substantially identical.

For example, the individual first, second, third or fourth electrical connections W1, W2, W3, W4 may exhibit at least one of (substantially) identical ohmic behaviors (ohmic resistances). (substantially) identical inductive behaviors (inductivities), and (substantially) identical capacitive behaviors (capacities). This may be achieved, e.g., if the individual first, second, third or fourth electrical connections W1, W2, W3, W4 are of identical lengths, identical cross-sectional areas, and identical materials.

An electrically symmetrical design provides identical voltage and current transfers over the respective conductor tracks and connection lines so that, for example, identical synchronous voltage impulses of the control voltage provided to the circuit arrangement 100 via the control potential terminal 71 and the reference potential terminal(s) 72 appear at the same time and in the same shape at the end of the lines, i.e. between the first load electrode 11 and the control electrode 13 of each of the semiconductor chips 1.

According to a further advantage of the layout of the present disclosure, the parasitic inductivities provide for a negative feedback. That is, if there is a significant change dI/dt of the load current I flowing through the parallelized load paths with t being the time, e.g. if the load paths are switched from an electrically conductive into an electrically blocking state, an inductive voltage caused by parasitic inductivities is fed back from the load circuit (e.g. the drain-source circuit) to the control circuit (e.g. the gate-source circuit) so that it causes the semiconductor elements T to counteract the significant change dI/dt. Such a negative feedback significantly improves the short circuit strength of the arrangement 100.

The symmetrical design improves the transmission characteristics not only of the load circuit (which includes the parallelized load paths of the semiconductor elements T) but also of the control circuit of the semiconductor arrangement 100.

According to a further aspect of the invention, the different partial currents flowing through the same conductor track (for instance, each partial current may be a current through the parallelized load paths of the semiconductor elements T integrated in the semiconductor chips of one of the subsets) may be balanced using through holes formed in the respective conductor track. For instance, at least one first through hole 61 (e.g. one first through hole 61, two first through holes 61, . . . ) may be formed in the first section 41 of the second conductor track M2 between the first subset (including the semiconductor chips 1-1) and the second subset (including the semiconductor chips 1-2). Analogously, at least one second through hole 62 (e.g. one second through hole 62, two second through holes 62, . . . ) may be formed in the second section 42 of the second conductor track M2 between the third subset (including the semiconductor chips 1-3) and the fourth subset (including the semiconductor chips 1-4). According to a further example, at least one third through hole 63 (e.g. one third through hole 63, two third through holes 63, . . . ) may be formed in the first conductor track M in the region between the base section 30 and the third section 33.

In the proposed design, the parallelized semiconductor chips 1 may be arranged within a u-shaped section of the first conductor track M1, the u-shaped section being formed by the first and second sections 31, 32 and the base section 30 of the first conductor track M1.

A further advantage of the present invention is that each of the first load electrodes 11 may be connected via an individual current path to the same (simply or non-simply connected) first conductor track M1 so that there is no requirement to provide two or more first conductor tracks M1 having substantially the same potential as the first load electrodes 11 (e.g. the drain, source, emitter or collector potential). Analogously, each of the second load electrodes 12 may be mounted on and electrically connected to the same (simply or non-simply connected) second conductor track M2 so that there is no requirement to provide two or more second conductor tracks M2 having substantially the same potential as the second load electrodes 12 (e.g. the source, drain, collector or emitter potential).

Figure 4:
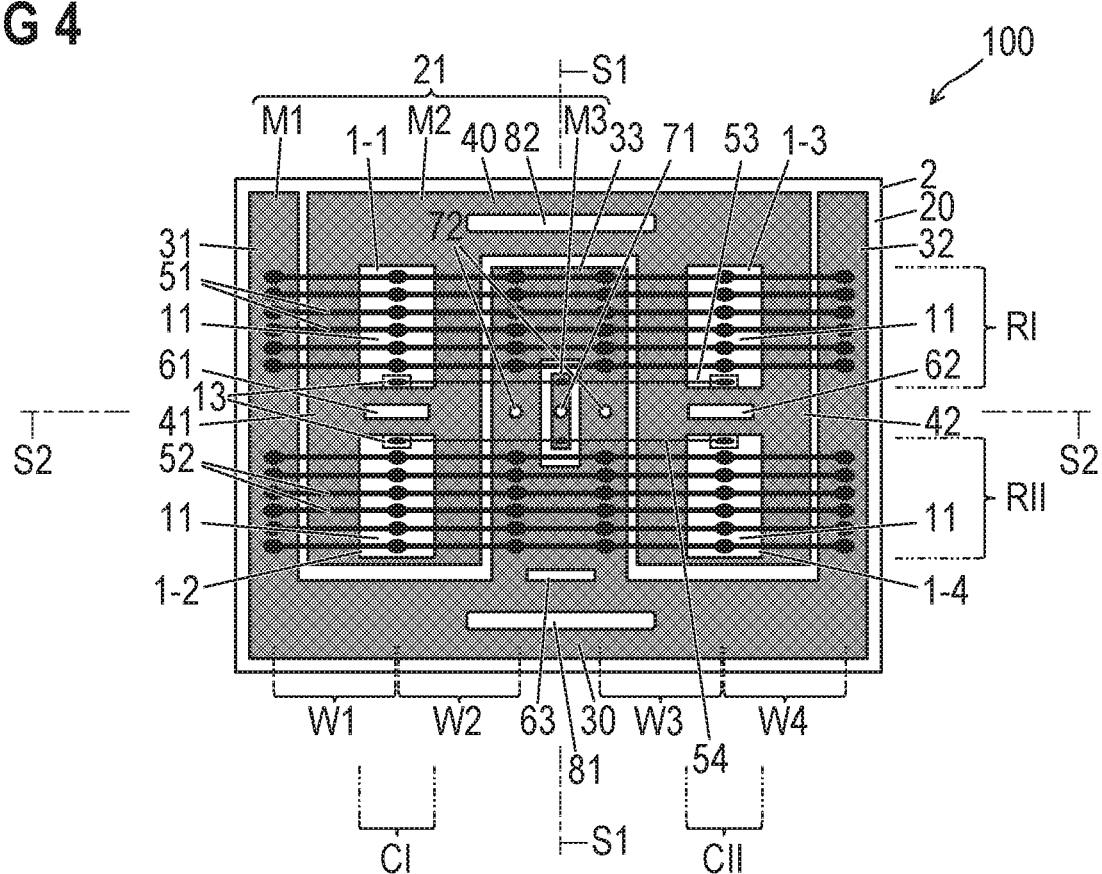
FIG. 4 is a top view illustrating a further exemplary semiconductor arrangement.

A further exemplary semiconductor arrangement 100 according to the principles described above is illustrated in FIG. 4. The difference as compared to the semiconductor arrangement 100 of FIGS. 1 and 2 is that each of the (first, second, third and fourth) subsets includes just one semiconductor chip 1 (each including a controllable semiconductor element T), and that the number and the locations of the points P of attachment are adapted to fit with the amended number of semiconductor chips 1. As in the arrangement of FIGS. 1 and 2, the first, second, third and fourth subsets are arranged in two rows RI and RII and two columns CI and CII.

However, the present invention is not restricted to semiconductor arrangements 100 having the subsets arranged in two rows RI and RII and two columns CI and CII. Following the principles described with reference to the examples described above, a semiconductor arrangement 100 may generally have its subsets of semiconductor chips 1 arranged in two or more rows RI and RII and two or more columns CI and CII.

During operation of a semiconductor arrangement 100 of the present invention, the direction of an averaged load current I (averaged over the first and second conductor tracks M1 and M2) flowing at an instant of time through the parallelized load paths, may be parallel or substantially parallel to the first, second and third section 31, 32, 33 of the first conductor track M1.

Figure 5:
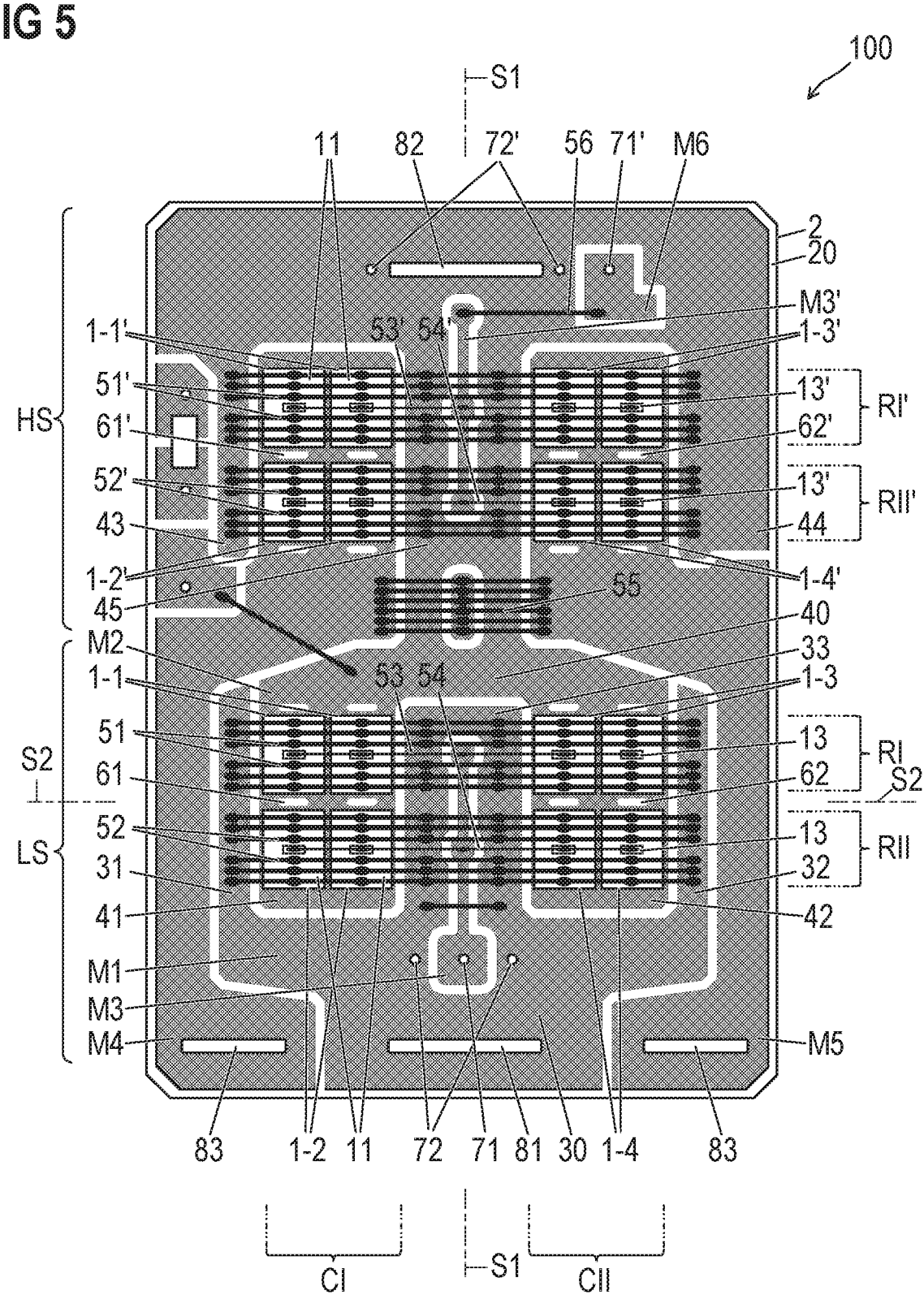
FIG. 5 is a top view illustrating an exemplary semiconductor arrangement that includes a half bridge.

FIG. 5 is a top view of a semiconductor arrangement 100 that includes a half bridge. The half bridge includes a low side branch LS and a high side branch HS. The design of the low side branch LS may show at least some of the features explained with reference to FIGS. 1 to 4. Insofar, reference is made to the description of FIGS. 1 to 4. Different from the examples of FIGS. 1, 2 and 4, the control potential terminal 71 and the at least one reference potential terminal 72 are not arranged in the middle between the first, second, third and fourth subsets. However, disposing the terminals 71, 72 the middle between the first, second, third and fourth subsets according to the principles explained with reference to FIGS. 1, 2 and 4 would also be possible.

In addition to the at least four subsets of semiconductor chips 1-1, 1-2, 1-3, 1-4, which are part of the low side branch LS, the plurality of semiconductor chips 1 includes at least four further subsets of semiconductor chips 1-1', 1-2', 1-3'. 1-4' which are part of the high side branch HS, wherein each of the further subsets includes at least one of the plurality of semiconductor chips 1, and wherein the further subsets do not intersect. In the following, elements of the high side branch HS which correspond to elements of the low side branch LS are labelled with the same reference numeral supplemented by an apostrophe ('). In FIG. 5, the semiconductor chips 1 of the first further subset are labelled with 1-1', the semiconductor chips 1 of the second further subset are labelled with 1-2', the semiconductor chips 1 of the third further subset are labelled with 1-3', and the semiconductor chips 1 of the fourth further subset are labelled with 1-4'. That is, in the example of FIG. 5, each of the further subsets includes two of the plurality of semiconductor chips 1. In general, however, each of the further subsets may include at least one, at least two, at least three, . . . of the plurality of semiconductor chips 1. Optionally but without being restricted to, each of the further subsets may include the same number of semiconductor chips 1. Also optionally, each of the subsets and each of the further subsets may include the same number of semiconductor chips 1.

As can be seen from FIG. 5, the first further subset (including the semiconductor chips 1-1') and the third further subset (including the semiconductor chips 1-3') may be arranged in a first further row RI', the second further subset (including the semiconductor chips 1-2') and the fourth further subset (including the semiconductor chips 1-4') may be arranged in a second further row RII', the first further subset (including the semiconductor chips 1-1') and the second further subset (including the semiconductor chips 1-2') may be arranged in the first column CI, and the third further subset (including the semiconductor chips 1-3') and the fourth further subset (including the semiconductor chips 1-4) may be arranged in the second column CII.

As can also be seen from FIG. 5, the semiconductor chips 1-1' of the first further subset and the semiconductor chips 1-2' of the second further subset are arranged on a fourth conductor track M4, and the semiconductor chips 1-3' of the third further subset and the semiconductor chips 1-4' of the fourth further subset are arranged on a fifth conductor track M5. Both the fourth and fifth conductor track M4, M5 may be parts of the first metallization layer 21 and spaced distant from one another and from the first, second and third conductor tracks M1, M2, M3. The first load electrode 11 of each of the semiconductor chips 1-1', 1-2' of the first and second further subsets is electrically connected to both a third section 43 and a fifth section 45 of the second conductor track M2. Then, the first load electrode 11 of each of the semiconductor chips 1-3', 1-4' of the third and fourth further subsets is electrically connected to the fifth section 45 and to a fourth section 44 of the second conductor track. That is, the first load electrode 11 of each of the semiconductor chips 1-1', 1-2' of the first and second further subsets is, via different electrical connections, e.g. bonding wires, electrically connected to both the third and fifth section 43, 45 of the second conductor track M2, and the first load electrode 11 of each of the semiconductor chips 1-3', 1-4' of the third and fourth further subsets is, via different electrical connections, e.g. bonding wires, electrically connected to both the fifth and fourth section 45, 44 of the second conductor track M2.

As illustrated in FIG. 5, the fourth and fifth conductor tracks M4, M5 may be electrically connected via one or more electrical connections 55, e.g. bonding wires, to one another. In any case, the load paths of the controllable semiconductor elements T integrated in the semiconductor bodies 10 of the semiconductor chips 1 of the first, second, third and fourth subsets are electrically connected in parallel because the first load electrodes 11 of the semiconductor chips 1 of the first, second, third and fourth subsets are electrically connected to one another via the first conductor track M1, and because the second load electrodes 12 of the semiconductor chips 1 of the first, second, third and fourth subsets are electrically connected to one another via the second conductor track M2. Therefore, the load path of the low side branch LS is formed between the first and second conductor tracks M1, M2.

Analogously, the load paths of the controllable semiconductor elements T integrated in the semiconductor bodies 10 of the semiconductor chips 1 of the first, second, third and fourth further subsets are electrically connected in parallel because the first load electrodes 11 of the semiconductor chips 1 of the first, second, third and fourth further subsets are electrically connected to one another via the second conductor track M2 and via electrical connections 51', 52', and because the second load electrodes 12 of the semiconductor chips 1 of the first, second, third and fourth further subsets are electrically connected to one another via the fourth conductor track M4, the fifth conductor track M5 and the at least one electrical connection 55. Therefore, the load path of the high side branch HS is formed between the second conductor track M2 on the one hand and the fourth and fifth conductor tracks M4, M5 on the other hand.

In order to form a half bridge, the load paths of the low side branch LS and the high side branch HS are electrically connected in series between the first conductor track M1 on the one hand and the fourth and fifth conductor tracks M4, M5 on the other hand. The load paths of the low side branch LS and the high side branch HS are electrically connected at the second conductor track M2 so that the second conductor track M2 forms a circuit node of the half bridge.

In order to electrically interconnect the control electrodes 13 of each of the semiconductor chips 1-1', 1-2', 1-3', 1-4' forming the first, second, third and fourth further subsets, the first metallization layer 21 may include a further third conductor track M3' arranged distant from both the first, second and third conductor tracks M1, M2 and M3. As illustrated in FIG. 5, a single connection line 53' may be used to electrically connect the control electrodes 13 of each of the semiconductor chips 1-1', 1-3' forming the first and third further subsets to the further third conductor track M3', and a further single connection line 54' may be used to electrically connect the control electrodes 13 of each of the semiconductor chips 1-2', 1-4' forming the second and fourth further subsets to the further third conductor track M3'. Whereas the third conductor track M3 electrically interconnects the control electrodes 13 of the semiconductor chips 1 of the low side branch LS, the further third conductor track M3' electrically interconnects the control electrodes 13 of the semiconductor chips 1 of the high side branch HS so that the semiconductor elements T integrated in the semiconductor chips 1 of the low side branch LS can be controlled synchronously via a control potential applied to the third conductor track M3' and that the semiconductor elements T integrated in the semiconductor chips 1 of the high side branch HS can be controlled synchronously via a further control potential applied to the further third conductor track M3' (and independently from the semiconductor elements T integrated in the semiconductor chips 1 of the high side branch LS).

A further control potential for controlling the controllable semiconductor elements T integrated in the semiconductor bodies 10 of the semiconductor chips 1 of the high side branch HS, i.e. for controlling the controllable semiconductor elements T integrated in the semiconductor bodies 10 of the semiconductor chips 1 of the first, second, third and fourth further subsets, may be provided to the further third conductor track M3' via a further control potential terminal 71'. In the example of FIG. 5, the further control potential terminal 71' is mounted on and electrically connected to a sixth conductor track M6 which in turn is, via an electrical connection 56. e.g. a bonding wire, electrically connected to the further third conductor track M3'. Alternatively, the further control potential terminal 71' may be mounted on and electrically connected to the further third conductor track M3' so that the sixth conductor track M6 and the electrical connection 56 can be omitted. The design of the further control potential terminal 71' may be the same as that of the control terminal 71, and it may, e.g., be pressed into a sleeve mounted on (e.g. soldered to) the conductor track (M6 or M3') on which the further control potential terminal 71' is mounted.

Similarly, a further reference potential may be provided to the second conductor track M2 via at least one further reference potential terminal 72' which is mounted on and electrically connected to the second conductor track M2. For instance, each further reference potential terminal 72 may be a pin that is pressed into a sleeve mounted on (e.g. soldered to) the second conductor track M2.

Whereas a control voltage for controlling the semiconductor elements T integrated in the semiconductor chips 1 of the low side branch LS may be provided to the low side branch LS via the at least one reference potential terminal 72 and the control terminal 71, a further control voltage for controlling the semiconductor elements T integrated in the semiconductor chips 1 of the high side branch HS may be provided to the high side branch HS via the at least one further reference potential terminal 72' and the further control terminal 71'.

In order to provide a supply voltage, e.g. a direct current (DC) voltage, to the half bridge, a first electrical potential V1 of the supply voltage may be applied to the first conductor track M1 (e.g. via the first load terminal 81), and a second electrical potential V2 of the supply voltage may be applied to the fourth and/or fifth conductor track M4, M5 (e.g. via a load terminal 83 mounted on and electrically connected to the respective fourth or fifth conductor track M4, M5). By switching the load path of the high side branch HS ON (i.e. into an electrically conductive state) and by switching the load path of the low side branch LS OFF (i.e. into an electrically blocking state), the second electrical potential V2 is connected to the second conductor track M2. Analogously, by switching the load path of the low side branch LS ON (i.e. into an electrically conductive state) and by switching the load path of the high side branch HS OFF (i.e. into an electrically blocking state), the first electrical potential V1 is connected to the fourth and fifth conductor tracks M4, M5.

Many of the above-identified advantages of the invention are based on a high degree of symmetry. For instance, there may be a first plane of symmetry S1 and/or a second plane of symmetry S2 to which certain constituents of the semiconductor arrangement are (arranged) mirror-symmetric (ally).

A further advantage that may be achieved using a semiconductor arrangement 100 according to present disclosure is an even temperature distribution among the semiconductor chips 1 during operation. Therefore, all semiconductor chips 1 experience substantially the same thermal stress.

According to a first aspect, the semiconductor chips 1-1, 1-2 of the first and second subsets may, with regard to the first plane of symmetry S1, be arranged symmetrically to the semiconductor chips 1-3, 1-4 of the third and fourth subsets.

According to a second aspect, the semiconductor chips 1-1, 1-3 of the first and third subsets may, with regard to the second plane of symmetry S2, be arranged symmetrically to the semiconductor chips 1-2, 1-4 of the second and fourth subsets.

According to a third aspect, the entirety of the connection lines 51 interconnecting the first load electrodes 11 of the semiconductor chips 1-1, 1-3 of the first and third subsets and the first, second and third sections 31, 32, 33 of the first conductor track M1 may, with regard to the second plane of symmetry S2, be arranged mirror-symmetrically to the entirety of the connection lines 52 interconnecting the first load electrodes 11 of the semiconductor chips 1-2, 1-4 of the second and fourth subsets and the first, second and third sections 31, 32, 33 of the first conductor track M1.

According to a fourth aspect, the first conductor track M1 may, with regard to the first plane of symmetry S1, be mirror-symmetric.

According to a fifth aspect, the second conductor track M2 may, with regard to the first plane of symmetry S1, be mirror-symmetric.

According to a sixth aspect, one, more than one or even the entirety of the connection lines 51 interconnecting the first load electrodes 11 of the semiconductor chips 1-1, 1-3 of the first and third subsets and the first, second and third sections 31, 32, 33 of the first conductor track M1 may, with regard to the first plane of symmetry S1, be mirror-symmetric.

According to a seventh aspect, one, more than one or even the entirety of the connection lines 52 interconnecting the first load electrodes 11 of the semiconductor chips 1-2, 1-4 of the second and fourth subsets and the first, second and third sections 31, 32, 33 of the first conductor track M1 may, with regard to the first plane of symmetry S1, be mirror-symmetric.

According to an eight aspect, the first through hole 61 may, with regard to the first plane of symmetry S1, be arranged symmetrically to the second through hole 62.

According to a ninth aspect, the first and second reference potential terminals 72 may, with regard to the first plane of symmetry S1, be arranged symmetrically to one another.

According to a tenth aspect, the first plane of symmetry S1 and/or the second plane of symmetry S2 may intersect the control potential terminal 71.

The aspects mentioned above are options in each case and may be combined within a semiconductor arrangement 100 in any combination.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor arrangement, comprising:
a circuit board comprising a metallization layer with a first conductor track and a second conductor track; and
a plurality of individual semiconductor chips each comprising a controllable semiconductor element, a first load electrode, a second load electrode and a control electrode, the first load electrodes of the individual semiconductor chips electrically connected to one another, the second load electrodes of the individual semiconductor chips electrically connected to one another, and the control electrodes of the individual semiconductor chips electrically connected to one another,
wherein the first conductor track has a base section and a plurality of further sections extending from the base section,
wherein the second conductor track has a plurality of sections,
wherein the further sections of the first conductor track and the sections of the second conductor track extend parallel to one another in a first direction at least over a same lateral dimension of the individual semiconductor chips,
wherein the further sections of the first conductor track alternate with the sections of the second conductor track in a second direction orthogonal to the first direction,
wherein the individual semiconductor chips are arranged on the sections of the second conductor track,
wherein the first load electrodes are connected to the further sections of the first conductor track.

2. The semiconductor arrangement of claim 1, wherein the first load electrodes are connected to the further sections of the first conductor track by wire bonds extending in the second direction.

3. The semiconductor arrangement of claim 2, wherein the wire bonds contact the further sections of the first conductor track interposed between adjacent ones of the individual semiconductor chips.

4. The semiconductor arrangement of claim 2, further comprising an additional wire bond connected to the control electrodes and extending in the second direction.

5. The semiconductor arrangement of claim 1, wherein the individual semiconductor chips are aligned with one another in a row in the second direction.

6. A half bridge semiconductor arrangement, comprising:
a circuit board comprising a metallization layer with a first low side conductor track, a second low side conductor track, a first high side conductor track, a second high side conductor track, and a third high side conductor track; and a plurality of individual semiconductor chips each comprising a controllable semiconductor element, a first load electrode, a second load electrode and a control electrode, the first load electrodes of the individual semiconductor chips electrically connected to one another, the second load electrodes of the individual semiconductor chips electrically connected to one another, and the control electrodes of the individual semiconductor chips electrically connected to one another;

a low side branch, comprising:
the first low side conductor track and having a base section and a plurality of further sections extending from the base section; and
the second low side conductor track and having a plurality of sections,
wherein the further sections of the first low side conductor track alternate with the sections of the section low side conductor track in a first direction,
wherein a first subset of the individual semiconductor chips are arranged on the sections of the second low side conductor track and the respective first load electrodes of the first subset of the individual semiconductor chips are connected to the further sections of the first low side conductor track; and a high side branch, comprising:
the first high side conductor track and having a base section and a plurality of further sections extending from the base section; and
the second high side conductor track and having a plurality of sections,
wherein the further sections of the first high side conductor track alternate with the sections of the second high side conductor track in the first direction,
wherein a second subset of the individual semiconductor chips are arranged on the sections of the second high side conductor track and the respective first load electrodes of the second subset of the individual semiconductor chips are connected to the further sections of the first high side conductor track.

7. The half bridge semiconductor of claim 6, wherein the second low side conductor track is connected to the first high side conductor track.

8. The half bridge semiconductor of claim 6, wherein the sections of the second low side conductor track merge with each other and with the further sections of the first high side conductor track.

9. The half bridge semiconductor of claim 6, wherein each one of the individual semiconductor chips included in the first subset is aligned in a row with one of the individual semiconductor chips included in the second subset in a second direction orthogonal to the first direction.

10. The half bridge semiconductor of claim 6, wherein the first load electrodes of the individual semiconductor chips included in the first subset are connected to the further sections of the first low side conductor track by first wire bonds extending in a second direction orthogonal to the first direction, and wherein the first load electrodes of the individual semiconductor chips included in the second subset are connected to the further sections of the first high side conductor track by second wire bonds extending in the second direction.

11. The half bridge semiconductor of claim 10, wherein the first wire bonds contact the further sections of the first low side conductor track interposed between adjacent ones of the individual semiconductor chips included in the first subset, and wherein the second wire bonds contact the further sections of the first high side conductor track interposed between adjacent ones of the individual semiconductor chips included in the second subset.

12. The half bridge semiconductor of claim 10, further comprising:
a first additional wire bond connected to the control electrodes of the individual semiconductor chips included in the first subset and extending in the second direction; and
a second additional wire bond connected to the control electrodes of the individual semiconductor chips included in the second subset and extending in the second direction.

13. A half bridge semiconductor arrangement, comprising:
a circuit board comprising a metallization layer with a first low side conductor track, a second low side conductor track, a first high side conductor track, a second high side conductor track, and a third high side conductor track; and
a plurality of individual semiconductor chips each comprising a controllable semiconductor element, a first load electrode, a second load electrode and a control electrode, the first load electrodes of the individual semiconductor chips electrically connected to one another, the second load electrodes of the individual semiconductor chips electrically connected to one another, and the control electrodes of the individual semiconductor chips electrically connected to one another,
wherein:
in a low side branch:
the first low side conductor track comprises a base section and a first, second and third section, the third section arranged between the first and second sections;
the second low side conductor track comprises a first and a second section;
the first section of the second low side conductor track is arranged between the first and the third section of the first conductor track;
the second section of the second low side conductor track is arranged between the second and the third section of the first conductor track;
the third section of the first low side conductor track is arranged between the first and the second section of the second conductor track;
a first subset of the plurality of semiconductor chips are arranged on the first section of the second low side conductor track;
a second subset of the plurality of semiconductor chips are arranged on the second section of the second low side conductor track;
the first load electrode of each of the semiconductor chips of the first subset is, via at least one first electrical connection, electrically connected to the first section of the first low side conductor track and, via at least one second electrical connection, to the third section of the first low side conductor track; and
the first load electrode of each of the semiconductor chips of the second subset is, via at least one third electrical connection, electrically connected to the third section of the first low side metallization and, via at least one fourth electrical connection, to the second section of the first low side conductor track; and in a high side branch:

a first high side conductor track comprises a base section and a first, second and third section, the third section arranged between the first and second sections;

a second high side conductor track and a third high side conductor track are connected together;

the second high side conductor track is arranged between the first and the third section of the first conductor track;

the third high side conductor track is arranged between the second and the third section of the first conductor track;

the third section of the first high side conductor track is arranged between the second high side conductor track and the third high side conductor track;

a third subset of the plurality of semiconductor chips are arranged on the second high side conductor track;

a fourth subset of the plurality of semiconductor chips are arranged on the third high side conductor track;

the first load electrode of each of the semiconductor chips of the third subset is, via at least one first electrical connection, electrically connected to the first section of the first high side conductor track and, via at least one second electrical connection, to the third section of the first high side conductor track; and the first load electrode of each of the semiconductor chips of the fourth subset is, via at least one third electrical connection, electrically connected to the third section of the first high side conductor track and, via at least one fourth electrical connection, to the second section of the first high side conductor track.

14. The semiconductor arrangement of claim 13, wherein:

the second high side conductor track is connected to the third high side conductor track by wire bonds.

15. The semiconductor arrangement of claim 13, wherein the second low side conductor track is connected to the first high side conductor track.

* * * * *